United States Patent [19]
Prantl et al.

[11] Patent Number: 6,103,453
[45] Date of Patent: Aug. 15, 2000

[54] PHOTOINITIATOR BLENDS

[75] Inventors: Bernhard Prantl, Worms; Erich Beck, Ladenburg; Matthias Lokai, Enkenbach-Alsenborn; Christof Kandzia, Wachenheim, all of Germany

[73] Assignee: BASF Aktiengesellschaft, Ludwigshafen, Germany

[21] Appl. No.: 09/268,725

[22] Filed: Mar. 17, 1999

[30] Foreign Application Priority Data

Mar. 24, 1998 [DE] Germany .......................... 198 12 859

[51] Int. Cl.[7] ...................................................... G03C 1/73
[52] U.S. Cl. ........................ 430/281.1; 430/916; 522/64; 522/18; 522/908
[58] Field of Search ................ 522/64, 18, 908; 430/281.1, 916

[56] References Cited

U.S. PATENT DOCUMENTS

| | | | |
|---|---|---|---|
| 4,265,723 | 5/1981 | Hesse et al. | 204/159.23 |
| 4,292,152 | 9/1981 | Lechtken et al. | 204/159.15 |
| 4,737,593 | 4/1988 | Ellrich et al. | 568/15 |
| 4,792,632 | 12/1988 | Ellrich et al. | 568/15 |
| 5,218,009 | 6/1993 | Rutsch et al. | 522/16 |
| 5,399,770 | 3/1995 | Leppard et al. | 568/15 |
| 5,767,169 | 6/1998 | Leppard et al. | 522/64 |

FOREIGN PATENT DOCUMENTS

| | | |
|---|---|---|
| 20 37 769 | 9/1991 | Canada . |
| 0 007 086 | 1/1980 | European Pat. Off. . |
| 0 007 508 | 2/1980 | European Pat. Off. . |
| 0 184 095 | 6/1986 | European Pat. Off. . |
| 0 446 175 | 9/1991 | European Pat. Off. . |
| 197 08 294 | 9/1997 | Germany . |
| 2 310 855 | 9/1997 | United Kingdom . |

*Primary Examiner*—Cynthia Hamilton
*Assistant Examiner*—Rosemary Ashton
*Attorney, Agent, or Firm*—Oblon, Spivak, McClelland, Maier & Neustadt, P.C.

[57] ABSTRACT

A photoinitiator blend, containing
a) at least one monoacylphosphine oxide of formula I $$R^1-\underset{\underset{R^2}{|}}{\overset{\overset{O}{\|}}{P}}-\overset{\overset{O}{\|}}{C}-R^3 \qquad \text{I}$$

in which
$R^1$ denotes $C_1$–$C_{18}$ alkyl; $C_1$–$C_4$ alkyl, $C_5$–$C_8$ cycloalkyl, $C_7$–$C_9$ phenylalkyl, phenyl, naphthyl, biphenyl, all substituted by halogen or $C_1$–$C_6$ alkoxy; phenyl, naphthyl or biphenylyl, all mono- or poly-substituted by halogen, $C_1$–$C_{12}$ alkyl and/or $C_1$–$C_{12}$ alkoxy; or a monovalent N—, O—, or S—containing 5-membered or 6-membered heterocyclic radical, $R^2$ denotes phenyl, naphthyl, biphenylyl; phenyl, naphthyl or biphenylyl, all mono- or poly-substituted by halogen, $C_1$–$C_{12}$ alkyl and/or $C_1$–$C_{12}$ alkoxy; a monovalent N—, O—, or S—containing 5-membered or 6-membered heterocyclic radical, $C_1$–$C_{18}$ alkoxy, phenoxy; phenoxy substituted by halogen, $C_1$–$C_4$ alkyl or $C_1$–$C_4$ alkoxy; benzyloxy, cyclohexyloxy or $R^2$ and $R^1$ form a ring together with the phosphorus atom, $R^3$ denotes $C_1$–$C_{18}$ alkyl; $C_1$–$C_4$ alkyl, $C_5$–$C_8$ cycloalkyl, $C_7$–$C_9$ phenylalkyl, phenyl, naphthyl, biphenylyl, all substituted by halogen or $C_1$–$C_6$ alkoxy; phenyl, naphthyl or biphenylyl, all mono- or poly-substituted by halogen, $C_1$–$C_{12}$ alkyl and/or $C_1$–$C_{12}$ alkoxy; a monovalent N—, O—, or S—containing 5-membered or 6-membered heterocyclic radical or a group $$-X-\overset{\overset{O}{\|}}{C}-\underset{\underset{R^2}{|}}{\overset{\overset{O}{\|}}{P}}-R^1$$

in which
X $C_2$–$C_8$ alkene, cyclohexylene or unsubstituted or; phenylene, or biphenylene, both substituted by halogen, $C_1$–$C_4$ alkyl or $C_1$–$C_4$ alkoxy;

b) at least one diacylphosphine oxide of formula II $$R^5-\overset{\overset{O}{\|}}{C}-\underset{\underset{R^4}{|}}{\overset{\overset{O}{\|}}{P}}-\overset{\overset{O}{\|}}{C}-R^6 \qquad \text{II}$$

in which
$R^4$ denotes $C_1$–$C_{18}$ alkyl; $C_1$–$C_4$ alkyl, $C_5$–$C_8$ cycloalkyl, $C_7$–$C_9$ phenylalkyl, phenyl, naphthyl, biphenylyl, all substituted by halogen or $C_1$–$C_6$ alkoxy; phenyl, naphthyl or biphenylyl, all mono- or poly-substituted by halogen, $C_1$–$C_{12}$ alkyl and/or $C_1$–$C_{12}$ alkoxy; a monovalent N—, O—, or S—containing 5-membered or 6-membered heterocyclic radical, $C_1$–$C_{18}$ alkoxy, phenoxy; phenoxy substituted by halogen, $C_1$–$C_4$ alkyl or $C_1$–$C_4$ alkoxy; benzyloxy, cyclohexyloxy and $R^5$ and $R^6$ independently denote $C_1$–$C_{18}$ alkyl; $C_1$–$C_4$ alkyl, $C_5$–$C_8$ cycloalkyl, $C_7$–$C_9$ phenylalkyl, phenyl, naphthyl, biphenylyl, all substituted by halogen or $C_1$–$C_6$ alkoxy; phenyl, naphthyl or biphenylyl, all mono- or poly-substituted by halogen, $C_1$–$C_{12}$ alkyl and/or $C_1$–$C_{12}$ alkoxy; a monovalent N—, O—, or S—containing 5-membered or 6-membered heterocyclic radical.

9 Claims, No Drawings

PHOTOINITIATOR BLENDS

The invention relates to a photoinitiator blend, containing a) at least one monoacylphosphine oxide of formula I

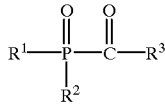

in which
R$^1$ denotes C$_1$–C$_{18}$ alkyl; C$_1$–C$_4$ alkyl, C$_5$–C$_8$ cycloalkyl, C$_7$–C$_9$ phenylalkyl, phenyl, naphthyl, biphenyl, all substituted by halogen or C$_1$–C$_6$ alkoxy; phenyl, naphthyl or biphenylyl, all mono- or poly-substituted by halogen, C$_1$–C$_{12}$ alkyl and/or C$_1$–C$_{12}$ alkoxy; or a monovalent N—, O—, or S—containing 5-membered or 6-membered heterocyclic radical, R$^2$ denotes phenyl, naphthyl, biphenylyl; phenyl, naphthyl or biphenylyl, all mono- or poly-substituted by halogen, C$_1$–C$_{12}$ alkyl and/or C$_1$–C$_{12}$ alkoxy; a monovalent N—, O—, or S—containing 5-membered or 6-membered heterocyclic radical, C$_1$–C$_{18}$ alkoxy, phenoxy; phenoxy substituted by halogen, C$_1$—C$_4$ alkyl or C$_1$–C$_4$ alkoxy; benzyloxy, cyclohexyloxy, or R$^2$ and R$^1$ form a ring together with the phosphorus atom, R$^3$ denotes C$_1$–C$_{18}$ alkyl; C$_1$–C$_4$ alkyl, C$_5$–C$_8$ cycloalkyl, C$_7$–C$_9$ phenylalkyl, phenyl, naphthyl, biphenylyl, all substituted by halogen or C$_1$–C$_6$ alkoxy; phenyl, naphthyl or biphenylyl, all mono- or poly-substituted by halogen, C$_1$–C$_{12}$ alkyl and/or C$_1$–C$_{12}$ alkoxy; a monovalent N—, O—, or S—containing 5-membered or 6-membered heterocyclic radical or a group of the formula

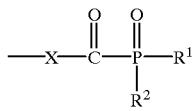

in which
X denotes C$_2$–C$_8$ alkene, cyclohexylene; or is phenylene or biphenyl, both unsubstituted or substituted by halogen, C$_1$–C$_4$ alkyl or C$_1$–C$_4$ alkoxy;

b) at least one diacylphosphine oxide of formula II

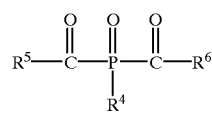

in which
R$^4$ denotes C$_1$–C$_{18}$ alkyl; C$_1$–C$_4$ alkyl, C$_5$–C$_8$ cycloalkyl, C$_7$–C$_9$ phenylalkyl, phenyl, naphthyl, biphenylyl, all substituted by halogen or C$_1$–C$_6$ alkoxy; phenyl, naphthyl or biphenylyl, all mono- or poly-substituted by halogen, C$_1$–C$_{12}$ alkyl and/or C$_1$–C$_{12}$ alkoxy; a monovalent N—, O—, or S—containing 5-membered or 6-membered heterocyclic radical, C$_1$–C$_{18}$ alkoxy, phenoxy; phenoxy substituted by halogen, C$_1$–C$_4$ alkyl or C$_1$–C$_4$ alkoxy; benzyloxy, cyclohexyloxy and R$_5$ and R$^6$ independently denote C$_1$–C$_{18}$ alkyl; C$_1$–C$_4$ alkyl, C$_5$–C$_8$ cycloalkyl, C$_7$–C$_9$ phenylalkyl, phenyl, naphthyl, biphenylyl, all substituted by halogen or C$_1$–C$_6$ alkoxy; phenyl, naphthyl or biphenylyl, all mono- or poly-substituted by halogen, C$_1$–C$_{12}$ alkyl and/or C$_1$–C$_{12}$ alkoxy; a monovalent N—, O—, or S—containing 5-membered or 6-membered heterocyclic radical.

Furthermore, the invention relates to radiation-curable compositions containing the photoinitiator blends.

Monoacylphosphine oxides are disclosed in, say, EP-A-7508 and EP-7086; diacylphosphine oxides in EP-A-184,095 and DE-A-19,708,294.

Photoinitiator blends containing acylphosphine oxides are described in EP 446,175.

A large number of demands are placed on photoinitiators which are to be used in radiation-curable compositions. Of special significance is high reactivity of the photoinitiators, by which is meant, on the one hand, fast curing, and, on the other hand, curing of even thick layers right down to the lower regions thereof.

Furthermore, the photoinitiators should not cause yellowing of the radiation-curable compositions or the coatings made therefrom.

To satisfy the various demands use may also be made of mixtures of photoinitiators. A prerequisite for this aim is that the photoinitiators should be readily miscible over as wide a range of mixing proportions as possible.

Photoinitiators and photoinitiator blends known hithertos do not yet satisfy the various demands to the desired extent.

It is an object of the present invention to provide photoinitiator blends starting from known photoinitiators, which blends are stable on storage, are readily miscible and processable and well satisfy demands such as high reactivity, low yellowing, and curing of thick and pigmented layers.

Accordingly, we have found the photoinitiator blend defined above and radiation-curable compositions containing said photoinitiator blend.

The photoinitiator blend of the invention contains at least one monoacylphosphine oxide of formula I and at least one diacylphosphine oxide of formula II.

In formula I,
R$^1$ preferably stands for phenyl or a phenyl group that is substituted by halogen, C$_1$–C$_{12}$ alkyl or mono- or poly-substituted by C$_1$–C$_{12}$ alkoxy.

More preferably R$^1$ stands for phenyl or a phenyl group that is substituted by from 1 to 3 C$_1$–C$_4$ alkyl groups. In particular, the alkyl groups are methyl groups.

Most preferably, R$^1$ is phenyl.

R$^2$ preferably stands for phenyl; phenoxy; a phenyl or phenoxy group that is mono- or poly-substituted by halogen, C$_1$–C$_{12}$ alkyl or a C$_1$–C$_{12}$ alkoxy group; or a C$_1$–C$_{18}$ alkoxy group.

More preferably R$^2$ stands for phenyl; phenoxy; a phenyl or phenoxy group that is substituted by from 1 to 3 alkyl groups, particularly methyl groups; or a C$_1$–C$_8$ alkoxy group.

Most preferably, R$^2$ stands for a C$_1$–C$_8$ alkoxy group and in particular, for a C$_1$–C$_4$ alkoxy group.

R$^3$ preferably stands for phenyl or a phenyl group that is mono- or poly-substituted by halogen, C$_1$–C$_{12}$ alkyl or C$_1$–C$_{12}$ alkoxy.

More preferably R$^3$ stands for a phenyl group which is substituted at at least positions 2 and 6, 2 and 4 or 2, 4 and 6 (relatively to the carbonyl group) by a C$_1$–C$_8$ alkyl group, preferably a C$_1$–C$_3$ alkyl group, particularly a methyl group.

Most preferably, $R^3$ stands for a 2,4-dimethylphenyl group or 2,4,6-trimethylphenyl group.

In formula II, $R^4$ preferably stands for phenyl; phenoxy; a phenyl or phenoxy group that is mono- or poly-substituted by halogen, $C_1$–$C_{12}$ alkyl or $C_1$–$C_{12}$ alkoxy; or a $C_1$–$C_{18}$ alkoxy group; or a $C_1$–$C_{18}$ alkyl group.

More preferably, $R^4$ stands for phenyl; phenoxy; or a phenyl group that is substituted by from 1 to 3 $C_1$–$C_4$ alkyl groups. In particular, the alkyl groups methyl groups.

Most preferably, $R^4$ stands for phenyl.

$R^5$ and $R^6$ preferably independently denote phenyl or a phenyl group that is mono- or poly-substituted by halogen, $C_1$–$C_{12}$ alkyl or $C_1$–$C_{12}$ alkoxy.

More preferably, $R^5$ and $R^6$ independently denote a phenyl group that is substituted at position 2 and 6, 2 and 4 and 2, 4 and 6 (relatively to the carbonyl group) by $C_1$–$C_8$ alkoxy or alkyl and more preferably $C_1$–$C_4$ alkoxy or alkyl.

Most preferably, $R^5$ and $R^6$ stand for a 2,4-dimethylphenyl group and in particular a 2,4,6-trimethylphenyl group.

Preferred monoacylphosphine oxides of formula I are, in particular:

Ia: $R^1$, $R^2$=phenyl, $R^3$=2,4,6-trimethylphenyl
Ib: $R^1$=phenyl, $R^2$=ethoxy, $R^3$=2,4,6-trimethylphenyl
Ic: $R^1$=phenyl, $R^2$=propoxy, $R^3$=2,4,6-trimethylphenyl
Id: $R^1$=phenyl, $R^2$=butoxy, $R^3$=2,4,6-trimethylphenyl Preferred diacylphosphine oxides of formula II are particularly:

IIa: $R^4$=phenyl, $R^5$, $R^6$,=2,4,6-trimethylphenyl
IIb: $R^4$=phenoxy, $R^5$, $R^6$=2,4,6-trimethylphenyl
IIc: $R^4$=$C_1$–$C_4$ alkyl , $R^5$, $R^6$=2,4,6-trimethylphenyl
IIe: $R^4$=propoxy, $R^5$, $R^6$=2,4,6-trimethylphenyl
IIf: $R^4$=butoxy, $R^5$, $R^6$=2,4,6-trimethylphenyl Monoacylphosphine oxides of formula I are preferably liquid at 21° C. (1 bar).

Diacylphosphine oxides of formula II are generally solid at 21° C.

The mixture is preferably liquid. The content of monoacylphosphine oxides a) is preferably from 70 to 98 wt %, more preferably from 75 to 95 wt % and most preferably from 80 to 90 wt %, based on the total weight of a) plus b).

The content of diacylphosphine oxides is correspondingly preferably from 2 to 30 wt %, more preferably from 5 to 25 wt % and most preferably from 10 to 20 wt %, based on the total weight of a) plus b).

The preparation of the photoinitiator blend of the invention can be carried out simply by mixing the compounds a) and b) in any order.

In particular, diacylphosphine oxides can be dissolved in monoacylphosphine oxides, or both mono- and di-acylphosphine oxides can be dissolved, individually or together, in a solvent, eg acetone, and, once the phosphine oxides have been mixed, the solvent can be removed by distillation. The photoinitiator blend of the invention is used in particular as a photoinitiator for the radiation-induced curing of ethylenically unsaturated compounds capable of being polymerized by free-radical polymerization.

The mixture containing the photoinitiator blend of the invention and at least one polymerizable, ethylenically unsaturated compound, is also referred to below as the radiation-curable composition.

Radiation-curable compounds suitable for free-radical polymerization are compounds having only one ethylenically unsaturated copolymerizable group (compounds A).

As examples thereof there may be mentioned $C_1$–$C_{20}$ alkyl (meth)acrylates, vinyl aromatic compounds having up to 20 carbon atoms, vinyl esters of carboxylic acids containing up to 20 carbon atoms, ethylenically unsaturated nitriles, vinyl ethers of alcohols containing from 1 to 10 carbon atoms and aliphatic hydrocarbons containing from 2 to 8 carbon atoms and having 1 or 2 double bonds.

Preferred alky (meth)acryates are those having a $C_1$–$C_{10}$ alkyl group, such as methyl methacrylate, methyl acrylate, n-butyl acrylate, ethyl acrylate and 2-ethylhexyl acrylate.

In particular, mixtures of alky (meth)acryates are also suitable.

Vinyl esters of carboxylic acids containing from 1 to 20 carbon atoms are eg vinyl laurate, vinyl stearate, vinyl propionate and vinyl acetate.

Suitable vinylaromatic compounds are, eg, vinyl toluene, α-butylstyrene, 4-n-butylstyrene, 4-n-decylstyrene and preferably styrene.

Examples of nitriles are acrylonitrile and methacrylonitrile.

Examples of suitable vinyl ethers are vinylmethyl ether, vinylisobutyl ether, vinylhexyl ether and vinyloctyl ether.

As examples of non-aromatics containing from 2 to 8 carbon atoms and one or two olefinic double bonds there may be mentioned butadiene, isoprene, and also ethylene, propene and isobutene.

Preferred radiation-curable compounds polymerizable by radical polymerization are those containing a plurality of polymerizable ethylenically unsaturated groups (compounds B).

In particular, the compounds B) are (meth)acrylic compounds, the preferred compounds being the acrylates, ie derivatives of acrylic acid.

Preferred (meth)acrylic compounds B) contain from 2 to 20, preferably from 2 to 10 and more preferably from 2 to 6, copolymerizable ethylenically unsaturated double bonds.

The number-average molecular weight $M_n$ of the (meth)acrylic compounds B) is preferably below 15,000 and more preferably below 5,000, most preferably below 3,000 g/mol and above 180 g/mol (determined by gel-permeation chromatography using polystyrene as the standard substance and tetrahydrofuran as the eluent).

As examples of suitable (meth)acrylic compounds there may be mentioned (meth)acrylates, particularly acrylates, of polyfunctional alcohols, particularly those containing no other functional groups except, perhaps, ether groups, in addition to the hydroxyl groups. Examples of such alcohols are dihydric alcohols, such as ethylene glycol, propylene glycol and their more highly condensed representatives such as diethylene glycol, triethylene glycol, di-propylene glycol, tripropylene glycol etc., butane diol, pentane diol, hexane diol, neopentyl glycol, alkoxylated phenolic compounds, such as ethoxylated or propoxylated bisphenols, cyclohexane dimethanol, trihydric and higher-functional alcohols, such as glycerol, trimethylol propane, butane triol, trimethylol ethane, pentaerythritol, ditrimethylol propane, di-pentaerythritol, sorbitol, mannitol and the corresponding alkoxylated, particularly ethoxylated and propoxylated, alcohols.

The alkoxylation products are obtained in known manner by reaction of the above alcohols with alkylene oxides, particularly ethylene oxide or propylene oxide. Preferably the degree of alkoxylation per hydroxyl group is from 0 to 10, ie 1 mole of hydroxyl group can be alkoxylated with, preferably, up to 10 moles of alkylene oxides.

As examples of other (meth)acrylic compounds there may be mentioned polyester (meth)acrylates, which are (meth)acrylates of polyesterols.

Examples of suitable polyesterols are those such as can be prepared by esterification of polycarboxylic acids, preferably dicarboxylic acids, with polyalcohols, preferably diols. The starting materials for such polyesters containing hydroxyl groups are known to the person skilled in the art. Preferred dicarboxylic acids which can be used are succinic acid, glutaric acid, adipic acid, sebacic acid, o-phthalic acid, the isomers and hydrogenation products thereof and also esterifiable derivatives, such as anhydrides or dialkyl esters of said acids. Suitable polyalcohols are the above alcohols, preferably ethylene glycol, propylene-1,2-glycol and propylene-1,3-glycol, butane-1,4-diol, hexane-1,6-diol, neopentyl glycol, cyclohexane dimethanol and also polyglycols of the class comprising ethylene glycol and propylene glycol.

Polyester (meth)acrylates can be prepared in a number of steps or in a single stage, such as is described in EP 279,303, from acrylic acid, polycarboxylic acid and polyalcohol.

Furthermore, compounds B) can be eg epoxide (meth) acrylates or urethane (meth)acrylates.

Suitable epoxide (meth)acrylates are eg those such as can be obtained by reaction of epoxidized olefins or mono-, di- or poly-glycidyl ethers, such as bisphenol A diglycidyl ether, with (meth)acrylic acid.

The reaction is known to the person skilled in the art and is described, eg, in R. Holmann, U.V. and E.B. Curing Formulation for Printing Inks and Paints, London 1984.

The urethane (meth)acrylates are, in particular, reaction products of hydroxyalkyl (meth)acrylates with poly- or di-isocyanates (cf R. Holmann, U.V. and E.B. Curing Formulation for Printing Inks and Paints, London 1984).

Of course, mixtures of different compounds B), particularly mixtures of the above (meth)acrylic compounds, can be used, if desired.

Suitable radiation-curable compounds B) are also, for example, unsaturated polyester resins, which consist substantially of polyalcohols, particularly diols, and polycarboxylic acids, particularly dicarboxylic acids, where one of the esterification components contains a copolymerizable ethylenically unsaturated group. Examples thereof are maleic acid, fumaric acid and maleic anhydride.

Preferred radiation-curable compounds are the (meth) acrylic compounds B).

Compounds B) are often used in admixture with compounds A), serving, for example, as reactive diluents.

Preferred radiation-curable compositions contain at least 40 wt % and more preferably at least 60 wt % of compounds B), particularly (meth)acrylic compounds B), based on the total weight of compounds A) plus B).

The radiation-curable compositions preferably contain from 0.05 to 15, more preferably from 0.1 to 7 and most preferably from 0.1 to 5, parts by weight of photoinitiator blend of the invention, based on 100 parts by weight of the polymerizable ethylenically unsaturated compounds (compounds A) plus B)).

Other photoinitiators can be used along with the photoinitiator blend of the invention. Examples of suitable such compounds are benzophenone, benzophenone derivatives, hydroxyacetophenone, hydroxyacetophenone derivatives etc, in which case the above amounts of photoinitiator are generally not exceeded.

Advantageously the radiation-curable compositions can contain amino compounds, which act as accelerators.

These may be primary, secondary or tertiary amino compounds. Primary or secondary amino compounds are added to, say, the double bonds of the (meth)acrylic compounds B) by Michael condensation.

Preferably, the content of amino compounds is from 0.01 to 3 parts by weight of nitrogen and more preferably from 0.05 to 1 part by weight of nitrogen, based on 100 parts by weight of radiation-curable compounds A) plus B).

The radiation-curable compositions can contain eg pigments, colorants, levelling auxiliaries, stabilizing agents and other photoinitiators etc.. In the case of pigmented radiation-curable compositions the advantages of the photoinitiator blend of the invention are particularly noticeable Examples of other photoinitiators which can be used are anthraquinone and derivatives thereof, eg β-methyl anthraquinone or tert-butyl anthraquinone or benzoins.

The pigment concentration may be, for example, from 5 to 70 parts by weight and preferably from 10 to 50 parts by weight of pigment, based on 100 parts by weight of radiation-curable compounds A) plus B).

The radiation-curable compositions can be used as coating compositions, eg as varnish or printing ink or for the preparation of shaped articles, eg printing plates, photoresists or relief molds such as are produced by the stereolithography process, and also for the preparation of fiber-reinforced composites.

Furthermore, the photopolymerizable compositions can be used as filling or surfacing compounds. Particularly suitable for this application are the above compositions based on unsaturated polyesters or (poly)epoxide (meth) acrylates.

They are also suitable for use as dental compositions, eg as dental filling compounds or dentures.

The radiation-curable compositions are cured, in particular, by irradiation with UV light Curing can be carried out eg in daylight, if desired.

Suitable sources of radiation are eg low-pressure, medium-pressure and high-pressure mercury lamps and also fluorescent tubes, pulse radiators, metal halide radiators, electronic flash equipment or excited dimer emitters.

The radiation-curable compositions of the invention are stable on storage and show good, fast curing when irradiated. In addition, thick or pigmented coatings can be easily cured right down to the bottom regions thereof.

The photoinitiator blend of the invention gives off no unpleasant odors. It is preferably liquid and therefore easy to handle.

EXAMPLES

Examples 1–4

70 parts of the amine-modified polyether acrylate Laromer® LR 8894 (BASF AG) are formulated with 30 parts of rutile-type titanium(IV) oxide, 4.5 parts of a mixture of trimethylbenzophenone and monomethylbenzophenone (Esacure TZI, sold by Fratelli Lamberti) and 1.6 parts each of the phosphine oxide photoinitiators and photoinitiator blends listed in the table, using a dispersing device ("Dispermat") over a period of 15 minutes whilst protected from light.

In the case of solid initiators, these are predissolved in approximately three times their weight of acetone to improve incorporation thereof.

The mixtures are knife-coated onto polyethylene film to form a 12 μm thick layer thereon. The acetone-containing films are aired for 5 minutes at room temperature.

In order to determine the reactivity, the films are transported by a conveyer belt under a high-pressure mercury arc lamp having a wattage of 120 W/cm, at a distance of 15 cm therefrom. The velocity of the conveyer belt determined the duration of exposure of the films. Thus the maximum belt speed allowed to achieve complete curing is a measure of the reactivity of the liquid film. The degree of curing is tested by scratching with a fingernail.

Results

|  | Test No. | | | |
| --- | --- | --- | --- | --- |
|  | 1 | 2 | 3 | 4 |
| Phosphine oxide initiator |  | BAPO | TPO-L | 85% TPO-L 15% BAPO |
| State of phosphine oxide |  | solid | liquid | liquid |
| Crystallization following storage for 90 days at 3° C. |  | — | no | no |
| Auxiliary solvent to improve workability |  | yes | no | no |
| Reactivity (m/min) | 7 | 70 | 45 | 75 |

TPO-L: 2,4,6-trimethylbenzoylethoxyphenylphosphine oxide
BAPO: bis(2,4,6trimethylbenzoyl)phenylphosphine oxide Example 5

80 parts of the amine-modified polyether acrylate Laromer PO 84 F (BASF AG) are formulated with 20 parts of rutile-type titanium(IV) oxide, 2 parts of the dispersant Disperbyk 110 (sold by Byk) and 0.5 part of a mixture of 85% TPO-L and 15% Lucinine® TPO (=2,4,6-trimethylbenzoylbisphenylphosphine oxide) using a dispersing device ("Dispermat") over a period of 15 minutes whilst protected from light.

The mixtures are filled into a vessel having a height of 1 cm and exposed at a rate of 5 m/min to the radiation of two high-pressure mercury lamps at a distance of 15 cm therefrom. The cured layer is washed with ethyl acetate. The thickness of the completely cured layer is found to be 210 $\mu$m. Thus the cured layer is approximately twice as thick as is necessary to achieve opacity (disappearance of translucency).

We claim:

1. A photoinitiator blend, containing
a) at least one monoacylphosphine oxide of formula I

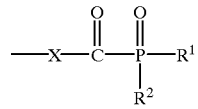

I in which $R^1$ denotes $C_1$–$C_{18}$ alkyl; $C_1$–$C_4$ alkyl, $C_5$–$C_8$ cycloalkyl, $C_7$–$C_9$ phenylalkyl, phenyl, naphthyl, biphenyl, all substituted by halogen or $C_1$–$C_6$ alkoxy; phenyl, naphthyl or biphenylyl, all mono- or poly-substituted by halogen, $C_1$–$C_{12}$ alkyl and/or $C_1$–$C_{12}$ alkoxy; or a monovalent N—, O—, or S—containing 5-membered or 6-membered heterocyclic radical, $R^2$ denotes phenyl, naphthyl, biphenylyl; phenyl, naphthyl or biphenylyl, all mono- or poly-substituted by halogen, $C_1$–$C_{12}$ alkyl and/or $C_1$–$C_{12}$ alkoxy; a monovalent N—, O—, or S—containing 5-membered or 6-membered heterocyclic radical, $C_1$–$C_{18}$ alkoxy, phenoxy; phenoxy substituted by halogen, $C_1$–$C_4$ alkyl or $C_1$–$C_4$ alkoxy; benzyloxy, cyclohexyloxy or $R^2$ and $R^1$ form a ring together with the phosphorus atom, $R^3$ denotes $C_1$–$C_{18}$ alkyl; $C_1$–$C_4$ alkyl, $C_5$–$C_8$ cycloalkyl, $C_7$–$C_9$ phenylalkyl, phenyl, naphthyl, biphenylyl, all substituted by halogen or $C_1$–$C_6$ alkoxy; phenyl, naphthyl or biphenylyl, all mono- or poly-substituted by halogen, $C_1$–$C_{12}$ alkyl and/or $C_1$–$C_{12}$ alkoxy; a monovalent N—, O—, or S—containing 5-membered or 6-membered heterocyclic radical or a group

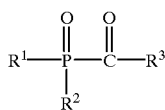

in which

X denotes $C_2$–$C_8$ alkene, cyclohexylene; or phenylene or biphenylene, both unsubstituted or substituted by halogen, $C_1$–$C_4$ alkyl or $C_1$–$C_4$ alkoxy;

b) at least one diacylphosphine oxide of formula II

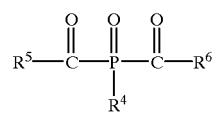

II in which $R^4$ denotes $C_1$–$C_{18}$ alkyl; $C_1$–$C_4$ alkyl, $C_5$–$C_8$ cycloalkyl, $C_7$–$C_9$ phenylalkyl, phenyl, naphthyl, biphenylyl, all substituted by halogen or $C_1$–$C_6$ alkoxy; phenyl, naphthyl or biphenylyl, all mono- or poly-substituted by halogen, $C_1$–$C_{12}$ alkyl and/or $C_1$–$C_{12}$ alkoxy; a monovalent N—, O—, or S—containing 5-membered or 6-membered heterocyclic radical, $C_1$–$C_{18}$ alkoxy, phenoxy; phenoxy substituted by halogen, $C_1$–$C_4$ alkyl or $C_1$–$C_4$ alkoxy; benzyloxy, cyclohexyloxy and $R^5$ and $R^6$ independently denote $C_1$–$C_{18}$ alkyl; $C_1$–$C_4$ alkyl, $C_5$–$C_8$ cycloalkyl, $C_7$–$C_9$ phenylalkyl, phenyl, naphthyl, biphenylyl, all substituted by halogen or $C_1$–$C_6$ alkoxy; phenyl, naphthyl or biphenylyl, all mono- or poly-substituted by halogen, $C_1$–$C_{12}$ alkyl and/or $C_1$–$C_{12}$ alkoxy; or a monovalent N—, O—, or S—containing 5-membered or 6membered heterocyclic radical.

2. A photoinitiator blend as defined in claim 1, wherein
$R^1$ stands for phenyl or a phenyl group that is substituted by halogen or $C_1$–$C_{12}$ alkyl or is mono- or poly-substituted by $C_1$–$C_{12}$ alkoxy, $R^2$ stands for phenyl, a phenyl group that is mono- or poly-substituted by halogen, $C_1$–$C_{12}$ alkyl or $C_1$–$C_{12}$ alkoxy; or is a $C_1$–$C_{18}$ alkoxy group and $R^3$ stands for phenyl or a phenyl group that is mono- or poly-substituted by halogen, $C_1$–$C_{12}$ alkyl or $C_1$–$C_{12}$ alkoxy.

3. A photoinitiator blend as defined in claim 2, wherein
$R^1$ stands for phenyl or a phenyl group that is substituted by from 1 to 3 methyl groups, $R^2$ stands for phenyl, phenoxy, a phenyl group or phenoxy group that is mono- or poly-substituted by methyl or a $C_1$–$C_8$ alkoxy group and $R^3$ stands for a 2,4,6-trimethylphenyl group or a 2,4-dimethylphenyl group.

4. A photoinitiator blend as defined in claim 1, wherein
$R^4$ stands for phenyl, phenoxy, a phenyl group or phenoxy group that is mono- or poly-substituted by halogen, $C_1$–$C_{12}$ alkyl or $C_1$–$C_{12}$ alkoxy; or is a $C_1$–$C_{18}$ alkoxy group or a $C_1$–$C_{18}$ alkyl group $R^5$ and $R^6$ independently stand for phenyl or a phenyl group that is mono- or poly- substituted by halogen, $C_1$–$C_{12}$ alkyl or $C_1$–$C_{12}$ alkoxy.

5. A photoiniator blend as defined in claim 4, wherein $R^4$ stands for phenyl, a phenyl group that is mono- or poly-substituted by methyl and $R^5$ and $R^6$ stand for a 2,4-dimethylphenyl group or a 2,4,6-trimethylphenyl group.

6. A photoinitiator blend as defined in claim 1, wherein the monoacylphosphine oxides a) are liquid.

7. A photoinitiator blend as defined in claim 1, wherein the content of monoacylphosphine oxides a) is from 70 to 98 wt % and that of diacylphosphine oxides b) is from 2 to 30 wt %, based on the sum of a) plus b).

8. A radiation-curable composition, containing at least one polymerizable ethylenically unsaturated compound and a photoinitiator blend as defined in claim 1.

9. A radiation-curable composition as defined in claim 8, containing from 0.05 to 15 parts by weight of the photoinitiator blend defined in 1, based on 100 parts by weight of polymerizable ethylenically unsaturated compounds.

* * * * *